(12) United States Patent
Salvi

(10) Patent No.: US 7,250,817 B2
(45) Date of Patent: Jul. 31, 2007

(54) LINEAR POWER EFFICIENT RADIO FREQUENCY (RF) DRIVER SYSTEM AND METHOD WITH POWER LEVEL CONTROL

(75) Inventor: Raul Salvi, Boca Raton, FL (US)

(73) Assignee: Motorola, Inc., Schaumburg, IL (US)

( * ) Notice: Subject to any disclaimer, the term of this patent is extended or adjusted under 35 U.S.C. 154(b) by 5 days.

(21) Appl. No.: 11/168,119

(22) Filed: Jun. 28, 2005

(65) Prior Publication Data

US 2006/0290424 A1    Dec. 28, 2006

(51) Int. Cl.
    *H03G 3/20*    (2006.01)
(52) U.S. Cl. .................. 330/129; 330/133; 330/285
(58) Field of Classification Search .............. 330/129, 330/133, 134, 279, 285, 296
    See application file for complete search history.

(56) References Cited

U.S. PATENT DOCUMENTS

| | | | |
|---|---|---|---|
| 6,009,119 A * | 12/1999 | Jovanovich et al. | ........ 375/295 |
| 6,480,700 B1 * | 11/2002 | Groe et al. | ................. 330/278 |
| 6,681,101 B1 | 1/2004 | Eidson et al. | |
| 6,684,064 B2 | 1/2004 | Kazakevich et al. | |
| 6,937,102 B2 * | 8/2005 | Lopez et al. | ................. 330/296 |

* cited by examiner

Primary Examiner—Khanh Van Nguyen

(57) ABSTRACT

A linear power efficient radio frequency (RF) driver system (100) includes a pre-driver amplifier (105) for amplifying an RF signal; and an output driver (107) having a substantially high impedance input for amplifying the signal from the pre-driver amplifier (105). A bias controller (109) is used for controlling the RF power output of the output driver (107) where the current drain of the pre-driver amplifier (105) and the bias controller (109) are controlled to a minimum level while maintaining linearity of the output driver (107). The system and method of the invention work to provide minimal current drain in portable products using simultaneous current and power amplifier reduction based on driver input swing to lower signal distortion.

16 Claims, 1 Drawing Sheet

LINEAR POWER EFFICIENT RADIO FREQUENCY (RF) DRIVER SYSTEM AND METHOD WITH POWER LEVEL CONTROL

TECHNICAL FIELD

This invention relates in general to radio frequency (RF) high power output amplifiers or attenuators and more particularly to control power applied to a driver stage in an RF transmitter.

BACKGROUND

Power control in RF transmitter systems is well known in the art and is commonly used to control transmitter output power depending on the proximity of the transmitter to a receiver in a radio or cellular telephone network. The power output may be controlled using radio signal strength indication (RSSI) measurement or otherwise so the receiving radio is not overloaded and to reduce power consumption in the transmitting communications device.

Controlling drive power of an RF amplifier is often essential in minimizing the amount of current drain in portable devices. U.S. Pat. No. 6,681,101 and U.S. Pat. No. 6,684,064, which are herein incorporated by reference, describe methods of controlling RF drive power. The '064 patent describes a dynamic bias for an RF power amplifier where operating bias of the RF transmitter is dynamically adjusted in response to a power control signal. The '101 patent describes an RF transmitter with an extended efficient power control arrangement where the transmitter includes stage switching, bias adjustment and drain supply modulation to provide fine and coarse power control and power envelope fluctuations. Although these systems operate to allow a reduction in power in an RF amplifier stage, they do not operate to conserve current drain or to trade off distortion for current. These prior art systems do not use a multistage approach where current is more efficiently used by controlling output power in both the low current driver stage as well as the high current amplifier stage while still maintaining overall linearity and high efficiency. When these types of transmitter power controls are used with portable devices, they do not function to reduce current drain since their design is solely for the purpose of varying the power output of the RF amplifier. These prior art systems are fixed at one current level for meeting specific design requirements such as linearity at power regardless of output power needed. Consequently, these designs can be highly inefficient and wasteful leading to high current drain and a shorter than necessary battery life. This can be very problematic in portable RF devices where battery life is of critical concern.

Accordingly, the need exists to provide a system and method for controlling RF power output in an RF amplifier while still operating to have an efficient current drain while maintaining linearity of an RF power amplifier.

DETAILED DESCRIPTION OF THE PREFERRED EMBODIMENT

Figure 1:
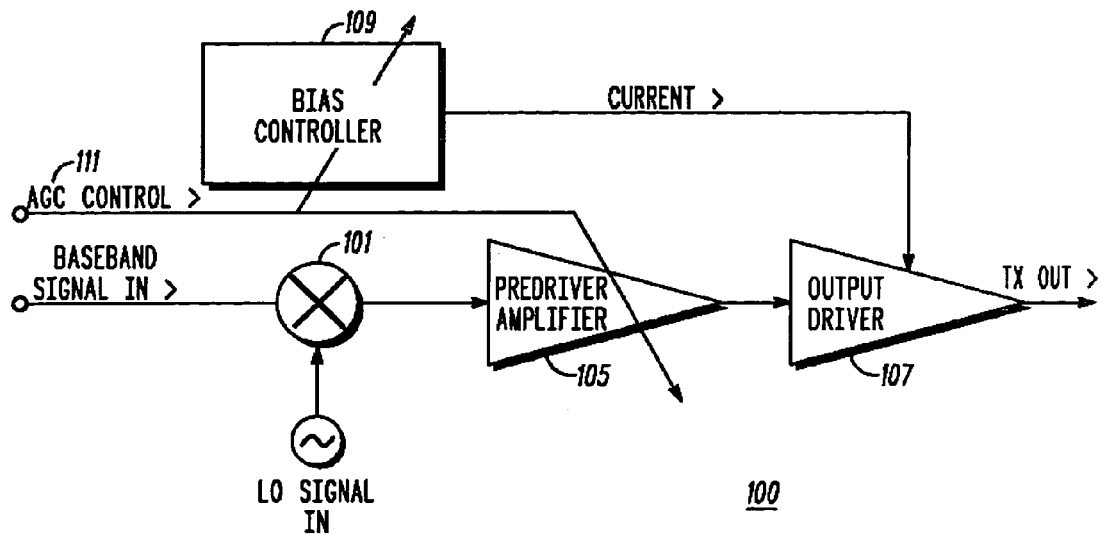
FIG. 1 is a block diagram illustrating a linear power efficient RF driver system with power level control in accordance with the invention.

Referring now to FIG. 1, a block diagram illustrates a linear power efficient RF driver system 100 with a power level control that works to both control output power and reduce current drain when power reduction is also required. A baseband signal and local oscillator signal are both supplied to a mixer 101. The resultant RF output signal from mixer 101 is supplied to a pre-driver amplifier 105. The pre-driver amplifier 105 works to increase the amplitude of the resultant RF output signal to some predetermined level. The pre-driver amplifier 105 is a high impedance low current design. The output of the pre-driver amplifier 105 is supplied to an output driver 107 which again provides gain to increase the RF signal supplied to it from the pre-driver amplifier 105 to a desired level. The output driver typically has a high impedance input which may be approximately 1000 ohms or more and provides the amplifier RF output signal to a low impedance output load such as a 50-ohm antenna or the like. The invention further includes a bias controller 109 which acts to control the bias supplied to the output driver 107. By controlling the bias of the output driver, the amount of dynamic range or slew capacity of the output driver can be controlled so as to produce the desired amount of linear output power. The bias controller 109 operates by matching the pre-driver signal gain control such that the slew capability and/or linearity of the output driver "tracks" the signal gain of the pre-driver amplifier 105 such that the current utilized by the output driver 107 is scaled to the input signal level at the pre-driver amplifier 105.

Although the bias controller 109 reduces current supplied to the output driver 107, the amount of operating current used by the pre-driver amplifier 105 and bias controller 109 remains constant. In order to provide increased efficiency and lower current drain, the amount of current used by these components may also be controlled using an automatic gain control (AGC) 111. The AGC 111 operates by scaling the amount of use by the pre-driver amplifier 105 and bias controller 109 such that the output driver 107 is supplied with only the amount of current that it needs to maintain predetermined linearity and gain requirements. So long as these minimal requirements are met, no current is wasted and maximum efficiency is achieved. The pre-driver amplifier 105 thus provides the required signal gain control at a much reduced current while the output driver bias current is automatically adjusted based on the signal level presented to it at its inputs by the pre-driver.

A principal advantage of this invention is in the use of the output driver 107 and pre-driver amplifier 105 combination. Since the input of the output driver 107 is a relatively high impedance, the pre-driver amplifier 105 does not have to drive a high current load that generally would be present with a low impedance. Consequently, a much smaller current drain is required by the pre-driver amplifier 105 to provide an RF voltage to the input of the output driver 107. Thus gain changes of the pre-driver amplifier 105 do not require different currents such as in the output driver 107. Moreover, the pre-driver amplifier 105 can be made much smaller, having a smaller capacitive load requiring even less current drain to drive a high impedance load.

Figure 2:
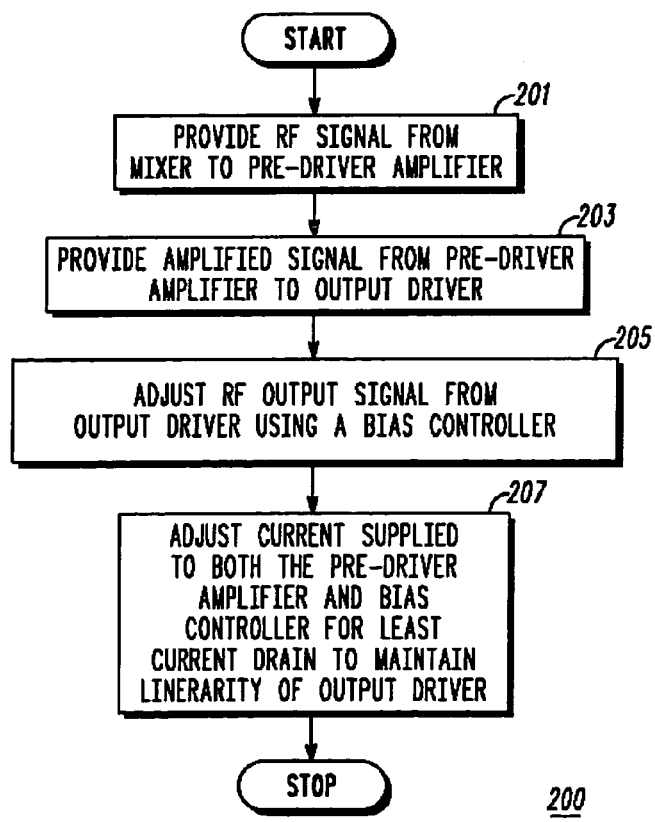
FIG. 2 is a flow chart diagram illustrating a linear power efficient RF driver system with power control in accordance with the method of the invention.

FIG. 2 is a flow chart diagram of the method for efficiently controlling the power in a linear radio frequency (RF) driver 200. The preferred method includes providing an RF signal from a mixer to a pre-driver amplifier 201. The pre-driver amplifier amplifies and controls signal level and supplies the amplifier RF signal to a substantially high impedance input where output driver slew capability is adjusted using a biased controller 205. In order to provide maximum current efficiency, the current supplied to the output driver is adjusted for the least current drain that will maintain linearity of the output driver 207.

Thus, the present invention provides a system and method for a linear power efficient RF driver system with power level control. The invention uses a signal gain controller pre-driver amplifier 105 which drives an output driver 107 having a substantially high impedance input. The output signal of the pre-driver amplifier 105 and the output current of the bias controller 109 are tuned by an AGC control line so as to utilize only a minimal amount of current by the output driver when the signal supplied to the output driver 107 is at a reduced level. This allows the bias current supplied by the bias controller 109 to the output driver 107 to be matched to the amount of gain control used by the pre-driver amplifier 105 to maintain optimal current drain efficiency for a given output signal level. Thus, the system and method of the invention use simultaneous current and power amp reduction based on driver input swing to lower signal distortion error at minimal current.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A linear power efficient radio frequency (RF) driver system comprising:
   at least one pre-driver amplifier for amplifying an RF signal;
   an output driver having a substantially high impedance input for amplifying the signal from the pre-driver amplifier;
   a bias controller for controlling the RF power output of the output driver;
   wherein the bias controller matches gain control of the pre-driver amplifier such that slew capability and linearity of the output driver tracks signal gain of the pre-driver amplifier whereby a current utilized by the output driver is scaled to the RF signal at the pre-driver amplifier; and
   wherein current supplied to the pre-driver amplifier and the bias controller are controlled to a minimum level while maintaining linearity of the output driver.

2. A linear power efficient RF driver system as in claim 1, wherein the at least one pre-driver amplifier has a substantially low load capacitance.

3. A linear power efficient RF driver system as in claim 1, wherein a bias current used by the pre-driver amplifier is adjusted to substantially match that of the bias controller.

4. A linear power efficient RF driver system as in claim 1, wherein a bias current used by the pre-driver amplifier is adjusted in a scaled relationship to that of the bias controller.

5. A linear power efficient RF driver system as in claim 1, wherein the output driver provides an RF output to a substantially low impedance.

6. A radio frequency (RF) driver system for efficiently adjusting
   power output of a power amplifier comprising:
   a mixer for providing an RF signal;
   a pre-driver amplifier for amplifying the RF signal;
   an output driver for amplifying the output of the pre-driver amplifier;
   a bias controller for controlling the output power of the output driver by adjusting output driver bias current wherein the bias controller matches gain control of the pre-driver amplifier such that slew capability and linearity of the output driver tracks signal gain of the pre-driver amplifier whereby a current utilized by the output driver is scaled to the RF signal at the pre-driver amplifier; and
   wherein a bias current used by the pre-driver amplifier is adjusted to a minimal level to maintain linearity of the output driver.

7. An RF driver system as in claim 6, wherein the input of the output driver is at a substantially high impedance for reducing the current used by the pre-driver amplifier.

8. An RF driver system as in claim 6, wherein the bias current used by the bias controller is adjusted in accordance with adjustment of the bias current to the pre-driver amplifier for maintaining high current drain efficiency.

9. An RF driver system as in claim 6, wherein the pre-driver amplifier has a substantially low load capacitance to minimize current drain.

10. An RF driver system as in claim 6, wherein the output driver drives a substantially low impedance.

11. A method for controlling a radio frequency (RF) driver system comprising the steps of:
    amplifying an RF signal using at least one pre-driver amplifier;
    amplifying the signal from the pre-driver amplifier using an output driver having a substantially high impedance input;
    adjusting the RF output power of the output driver using a bias controller to match gain control of the pre-driver amplifier such that slew capability and linearity of the output driver tracks signal gain of the pre-driver amplifier whereby a current utilized by the output driver is scaled to the RF signal at the pre-driver amplifier; and
    adjusting a bias current of the pre-driver amplifier and the bias controller level to a minimal level while maintaining linearity of the output driver.

12. A method for controlling an RF driver system as in claim 11, wherein the at least one pre-driver amplifier has a substantially low load capacitance.

13. A method for controlling an RF driver system as in claim 11, further comprising the step of:
    adjusting the bias current used by the pre-driver amplifier so it is substantially equal to that of the bias controller.

14. A method for controlling an RF driver system as in claim 11, further comprising the step of:
    adjusting the bias current used by the pre-driver amplifier in a scaled relationship to that of the bias controller.

15. A method for controlling the RF driver system as in claim 11, wherein the pre-driver amplifier has a substantially low capacitance to minimize current drain.

16. A method for controlling the RF driver system as in claim 11, further comprising the step of:
    providing the output of the output driver with a substantially low impedance.

* * * * *